(12) United States Patent
Shaheed (10) Patent No.: US 6,972,441 B2
(45) Date of Patent: Dec. 6, 2005

(54) SILICON GERMANIUM HETEROJUNCTION BIPOLAR TRANSISTOR WITH STEP-UP CARBON PROFILE

(75) Inventor: M. Reaz Shaheed, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/306,415

(22) Filed: Nov. 27, 2002

(65) Prior Publication Data
US 2004/0099880 A1 May 27, 2004

(51) Int. Cl.$^7$ .......................................... H01L 31/0328

(52) U.S. Cl. ..................... 257/197; 257/592

(58) Field of Search ................... 257/197, 198, 257/592; 438/312

(56) References Cited

U.S. PATENT DOCUMENTS

| 5,441,901 A | * | 8/1995 | Candelaria ............ 438/317 |
| 6,426,265 B1 | * | 7/2002 | Chu et al. ............ 438/312 |
| 6,509,587 B2 | * | 1/2003 | Sugiyama et al. ......... 257/192 |
| 6,673,688 B1 | * | 1/2004 | U'Ren et al. ............ 438/312 |
| 6,720,590 B2 | * | 4/2004 | Coolbaugh et al. ......... 257/197 |

OTHER PUBLICATIONS

John D. Cressler, "SiGe HBT Technology: A new Contender for Si-Based RF and Microwave Circuit Applications"—IEEE Transactions on Microwave Theory and Techniques, vol. 46, No. 5, May 1988, pp. 572-589 (18 pages).
B. Jagannathan, et al., "Self-Aligned SiGe NPN Transistors With 285 GHz $f_{MAX}$ and 207 GHZ $f_\gamma$ in a Manufacturable Technology", IEEE Electron Device Letters, vol. 23, No. 5, May 2002, pp. 258-260 (3 pages.).
Alvin J. Joseph, et al., "Impact of Profile Scaling on High-Injection Barrier Effects in Advanced UHV/CVD SiGe HBTs",1996 IEEE, pp. 10.3.1-10.3.4 (4 pages.).
D.V. Singh, et al., "Novel Epitaxial $p$-$Si$/$n$-$SI_{1-\gamma C}$/C p-$\gamma$Si Heterojunction Bipolar Transistors ", 2000 IEEE, 32-4. $1\mu$—3.4 (4 pages.).
K. E. Ehwald, et al., "Modular Integration of High-Performance SiGe:C HBTs in a Deep Submicron, Epi-Free CMOS Process", 1999 IEEE, pp. 22.3.1-22.3.4 (4 pages.).
H. Jorg Osten, et al., "Carbon Doping of SiGe Heterobipolar Transistors", 1998 IEEE, pp. 19-23 (5 pages.).

* cited by examiner

Primary Examiner—Sara Crane
(74) Attorney, Agent, or Firm—Blakely, Sokoloff, Taylor & Zafman LLP (57) ABSTRACT

A bipolar transistor having a collector connected to a base, the collector including an amount of carbon sufficient to prevent a conduction band barrier at a base-collector junction.

25 Claims, 6 Drawing Sheets

SILICON GERMANIUM HETEROJUNCTION BIPOLAR TRANSISTOR WITH STEP-UP CARBON PROFILE

FIELD

The present invention relates generally to the field of semiconductor technology and, more specifically, to a silicon germanium based heterojunction bipolar transistor with a carbon profile.

BACKGROUND

The silicon germanium heterojunction bipolar transistor ("SiGe HBT") has become extremely practical and efficient for use in technologies requiring high speed and high frequency operation, such as RF and microwave systems. SiGe HBTs can be specially tailored to be much faster than conventional silicon based MOSFETs and BJTs. In addition, because SiGe HBTs are silicon based, SiGe HBTs also enjoy the cost benefits of conventional Si based fabrication and are often fabricated alongside PMOS and NMOS transistors on the same silicon substrate.

Figure 1A:
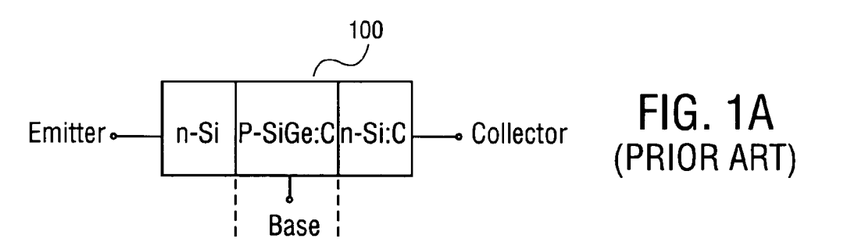
FIG. 1A illustrates a simplified SiGe HBT according to the prior art.
Figure 1B:
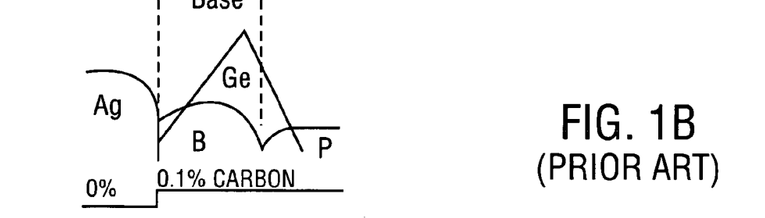
FIG. 1B illustrates a concentration profile for the SiGe HBT of FIG. 1A.

FIG. 1A illustrates a simplified structure of one conventional SiGe HBT 100 according to the prior art. Referring to FIG. 1A, the SiGe HBT 100 includes an n-type doped silicon emitter, a p-type doped silicon germanium base, and an n-type doped silicon collector. The dopant profile is indicated in FIG. 1B showing a sloped germanium ("Ge") grade in the base with part of the Ge grade deeply inserted into the collector, an arsenic doped emitter, a phosphorous doped collector, and a boron doped base. The base may also include a small amount of carbon (e.g., 0.1%) to prevent boron out-diffusion.

Figure 1C:
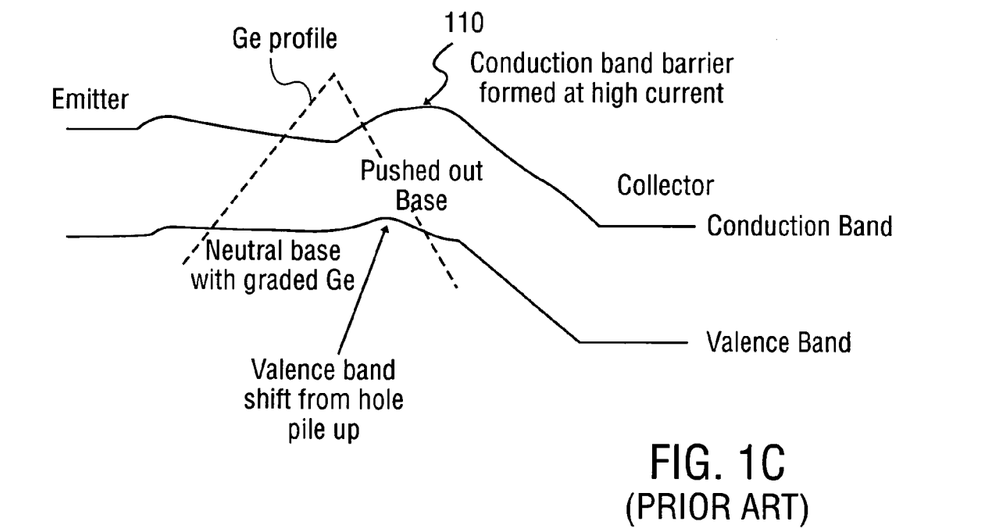
FIG. 1C illustrates a conduction band profile for the SiGe HBT of FIG. 1A at high current operation.

One of the challenges for the current technology, as shown in FIG. 1C, is that at high current density operation, the base-collector electric field collapses into a "pushed out" base. The Ge profile is graded deeply into the collector to help prevent a conduction band barrier at low to medium currents. However, at high current operation, as shown in FIG. 1C, when the pushed out base extends past the end of the Ge profile in the collector, a pile up of holes (positive carriers) results causing an increase in valence band energy, which, in turn, results in a potential barrier 110 in the conduction band. This conduction band barrier greatly diminishes the flow of electrons into the collector. The decrease of current flow can result in serious disadvantages at high current density operation, for example, significantly reducing the overall cutoff frequency ($f_T$) at high current densities. Therefore, the conventional SiGe HBT 100 is limited in physical dimensions and electrical operation.

BRIEF DESCRIPTION OF THE DRAWINGS

Embodiments of the present invention are illustrated by way of example and should not be limited by the figures of the accompanying drawings in which like references indicate similar elements and in which.

DETAILED DESCRIPTION

Described herein is a method and apparatus for a silicon germanium heterojunction bipolar transistor (SiGe HBT) with a step-up carbon profile. In the following description numerous specific details are set forth. One of ordinary skill in the art, however, will appreciate that these specific details are not necessary to practice embodiments of the invention. While certain exemplary embodiments are described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In other instances well-known semiconductor fabrication processes, techniques, materials, equipment, etc., have not been set forth in particular detail in order to not unnecessarily obscure embodiments of the present invention.

The SiGe HBT described herein includes a collector having a sufficient amount of carbon to reduce conduction band energy at the base-collector heterojunction, especially at high current operation. The carbon content of the collector causes a staggered offset of conduction band energy in the pushed-out region of the base, thus preventing a build up of positive carriers at the base-collector heterojunction. The cutoff frequency of the SiGe HBT, therefore, is not dependant on grading germanium into the collector, thus more germanium can be included in the base, which in turn allows the base to be formed to a larger size, which in turn reduces intrinsic base resistance and advantageously increases the maximum oscillation frequency ($f_{max}$) for the SiGe HBT. Therefore, the SiGe HBT has a high cutoff frequency and a high maximum oscillation frequency, even at very high currents, thus leading to an SiGe HBT with enhanced performance. Furthermore, since the SiGe HBT can withstand higher currents, the current density can also increase and, consequently, the SiGe HBT can be fabricated to very small dimensions, thus advantageously allowing for smaller integrated circuits.

Figure 2A:
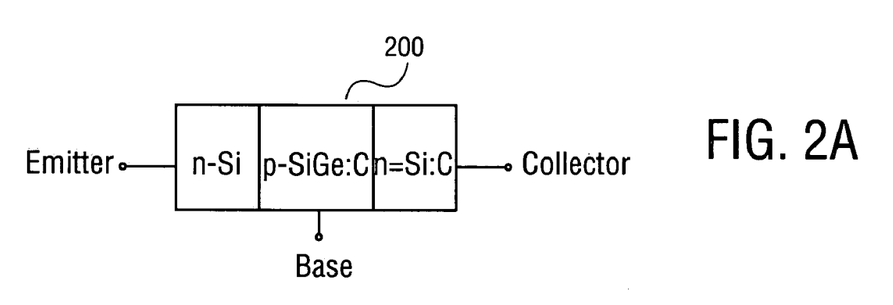
FIG. 2A illustrates a simplified structure of a SiGe HBT 200 according to one embodiment of the invention.

FIG. 2A is an illustration of a simplified structure of an SiGe HBT 200 according to one embodiment of the invention. Referring to FIG. 2A, the SiGe HBT 200 includes an emitter, a base and a collector. According to one embodiment of the invention, the emitter is an n-type silicon, the base is a p-type silicon-germanium with carbon, and the collector is a n-type silicon with carbon, thus making the SiGe HBT 200 an npn SiGe:C double HBT having an n-Si/p-SiGe:C emitter-base heterojunction and a p-SiGe:C/n-Si:C base-collector heterojunction. However, one ordinarily skilled in the art will recognize that other configurations may be possible. For example, another embodiment of the invention may include an SiGe HBT having no carbon in the base.

Figure 2B:
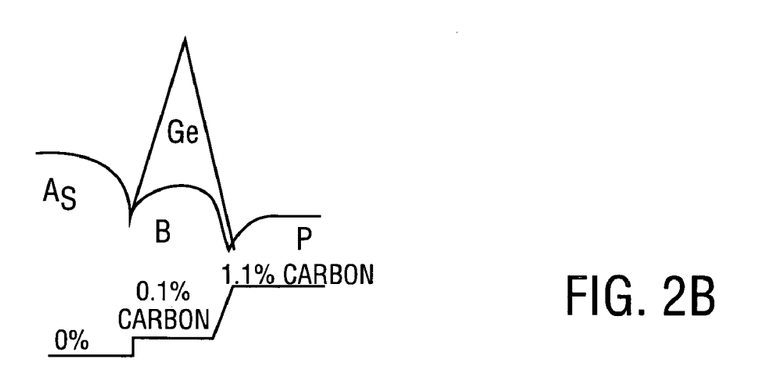
FIG. 2B illustrates a concentration profile for the SiGe HBT 200 of FIG. 2.

FIG. 2B illustrates the dopant profile for the SiGe HBT 200. As shown in FIG. 2B, the n-type and p-type dopants may include arsenic for the emitter, boron for the base, and phosphorous for the collector, however other dopants may be utilized instead, such as phosphorus in the emitter, indium in the base, antimony or arsenic in the collector. The base has a steeply graded germanium profile with a high peak. The collector is substantially free from germanium meaning that the germanium profile extends only slightly into the collector, if at all. One ordinarily skilled in the art will recognize that germanium may incidentally be formed into a portion of the collector, or subsequently diffuse into the collector, near the base-collector heterojunction, however the actual amount is insignificant. Likewise, the emitter is substantially free from either germanium or carbon.

The base connects with the emitter at the emitter-base heterojunction. The base has a low carbon content, for example about 0.1% carbon, or about $5 \times 10^{19}$ cm$^{-3}$ in carbon concentration, to prevent out-diffusion of the p-type dopant (e.g., boron). Such an amount may vary, however, as desired, for example between about 0% to about 0.4%. The collector includes a much higher carbon content, such as between about 0.5% to about 2% carbon, or between about $2.5 \times 10^{20}$ cm$^{-3}$ to about $1 \times 10^{21}$ cm$^{-3}$ in carbon concentration. The high carbon content in the collector is to reduce conduction band energy at the base-collector heterojunction. The high carbon concentration in the collector is especially advantageous for high current operation. Percentages, as described herein, refer to molecular count ratio. Hence, for example, a percentage of 0.1% carbon equals to 0.01 mole fraction. Additionally, to further clarify, percentages are also described in approximate concentration levels, where applicable.

Still referring to FIG. 2B, the SiGe HBT 200 includes a consistent carbon concentration throughout the entire base region and a consistent carbon concentration throughout the collector, with a "step-up" increase in carbon concentration at the base-collector heterojunction. This increase in carbon content from base to collector may be referred to herein as simply a "step-up carbon profile", which means the collector has a dramatic increase in carbon from that of the base. A step-up carbon profile having consistent amounts of carbon in the base and collector is easy to produce. However, one ordinarily skilled in the art will recognize that other configurations may exist. For example, the carbon content in the collector may be inconsistent, yet still have sufficient carbon therein to prevent a conduction band barrier. One possible alternate configuration may include a carbon profile that ramps up to a peak near the base-collector heterojunction with a consistent ramp-down inside the collector. Another alternate configuration may include a dramatic increase in carbon content at the base-collector heterojunction and a dramatic decrease leveling off to a consistent carbon level inside the collector. Furthermore, the base may even have no carbon content.

Figure 2C:
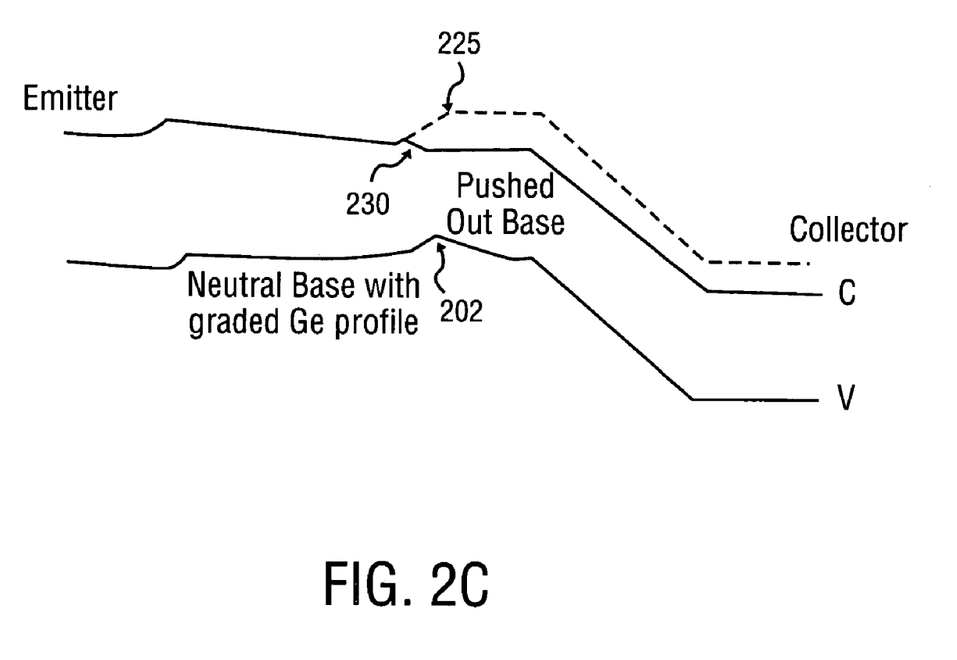
FIG. 2C illustrates a conduction band profile for the simplified SiGe HBT 200 of FIG. 2.

FIG. 2C illustrates an energy band diagram for the SiGe HBT 200 for a high current density, according to one embodiment of the invention. Referring to FIG. 2C, when the SiGe HBT 200 is operated for a high current to area ratio ("high current density"), the base effectively pushes out into the collector and the valence band experiences a discontinuity 202, or in other words an increase in valence energy. Just before the push out point, where the valence band increases in energy, conduction band has a tendency to also increase as a result of a pileup of positive charge carriers (holes) forming a conduction band barrier, 225, as shown in the dotted line in FIG. 2C. However, because of the high carbon content in the collector, a staggered offset 230 results in the conduction band that maintains the conduction band energy at about the same level as in the neutral base and therefore prevents the conduction band barrier.

Figure 2D:
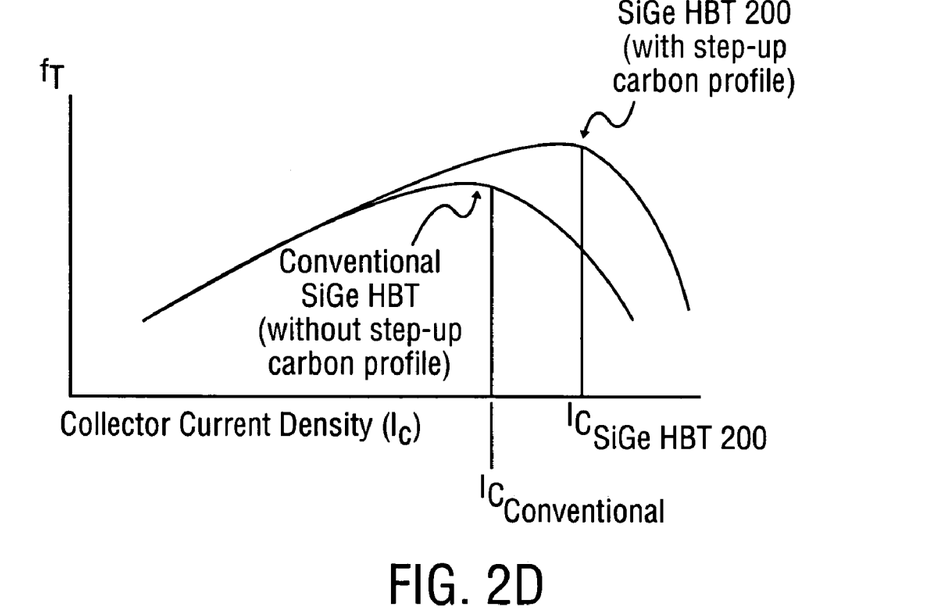
FIG. 2D illustrates a plot of cutoff frequency compared to current density for the SiGe HBT 200 of FIG. 2.

FIG. 2D illustrates a plot of cutoff frequency compared to current density for the SiGe HBT 200 and a conventional SiGe HBT. Cutoff frequency ($f_T$) is generally defined as the frequency at which the current gain of a transistor becomes unity, or in other words, the highest frequency that a transistor can amplify current. As shown in FIG. 2D, one advantage of the SiGe HBT 200 is that the cutoff frequency for the SiGe HBT 200 is higher for a step-up carbon profile than for a SiGe HBT having no step-up carbon profile. The cutoff frequency is higher for the SiGe HBT 200 because the conduction band barrier is prevented, therefore allowing the SiGe HBT 200 to continue to function at a higher current density than that of the conventional SiGe HBT having no step-up carbon profile. Consequently, the SiGe HBT 200 can be advantageously formed to smaller dimensions than a conventional SiGe HBT, and amplify currents to higher cutoff frequencies than the conventional SiGe HBT. Higher cutoff frequencies equate to higher speeds in analog/digital circuits. Therefore, the SiGe HBT 200 is much faster than a conventional SiGe HBT without a step-up carbon profile.

Figure 2E:
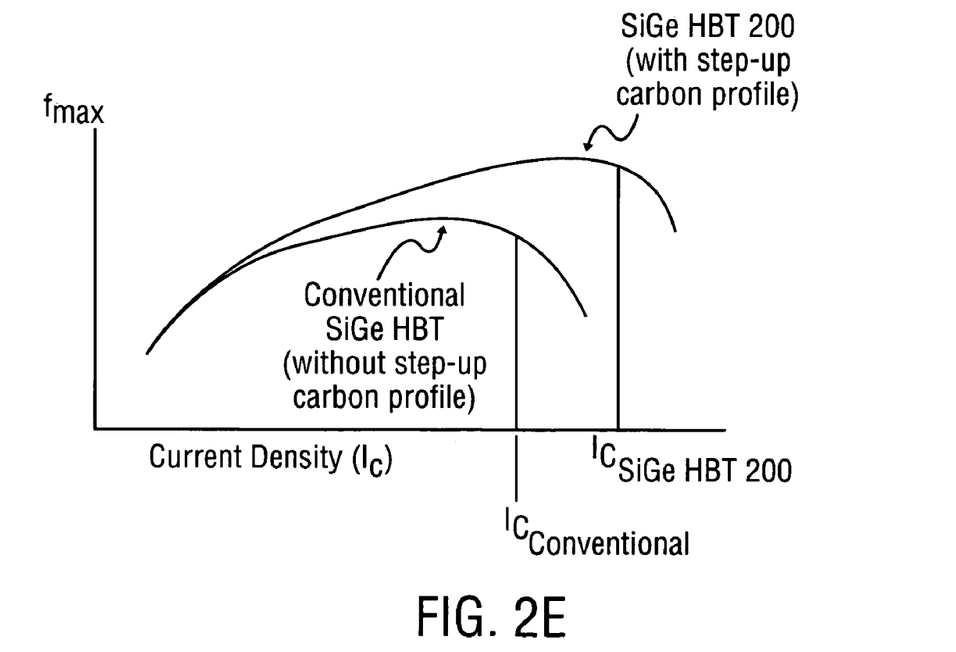
FIG. 2E illustrates a plot of maximum oscillation frequency compared to current density for the simplified SiGe HBT 200 of FIG. 2.

FIG. 2E illustrates a plot of maximum oscillation frequency compared to current density for the SiGe HBT 200 and a conventional SiGe HBT. Maximum oscillation frequency ($f_{max}$) is generally defined as the frequency at which the maximum power gain of a transistor becomes unity, or in other words, the highest frequency that a transistor can amplify power. Referring to FIG. 2E the SiGe HBT 200 having a step-up carbon profile has a higher maximum oscillation frequency than a conventional SiGe HBT without a step-up carbon profile in the collector. The $f_{max}$ is higher for the SiGe HBT 200 because the conduction band barrier is prevented, therefore allowing the SiGe HBT 200 to continue to function at a higher current densities than the SiGe HBT having no step-up carbon profile.

Consequently, the SiGe HBT 200 has both a high cutoff frequency and a high maximum oscillation frequency. As described previously, conventional SiGe HBTs relies on large amounts of deeply graded germanium in the collector to help prevent conduction barrier problems. However, to include more deeply graded germanium into the collector, the base thickness needs to be scaled very aggressively, or in other words, made very thin. Typically, a very small base thickness, however, results in a very high intrinsic base resistance, leading to a decrease in power gain, and therefore a decrease in $f_{max}$. The SiGe HBT 200, however, does not rely on large amounts of deeply graded germanium in the collector to overcome conduction barrier problems since the step-up carbon profile controls conduction barrier problems. Thus the SiGe HBT 200 can have a base that does not need to be scaled aggressively, or in other words, that does not need to be made very thin, which allows the base to have a low intrinsic resistance, thus allowing for a high $f_{max}$. Additionally, since the collector does not need deeply graded germanium, more germanium can be incorporated exclusively in the base of the SiGe HBT 200 without getting limited by SiGe film stability problems. Thus, the SiGe HBT 200 may include a base having a very high germanium peak and a very steep germanium profile, thus providing a very strong electrical field, resulting in a high $f_T$ especially at high current operation.

Figure 3:
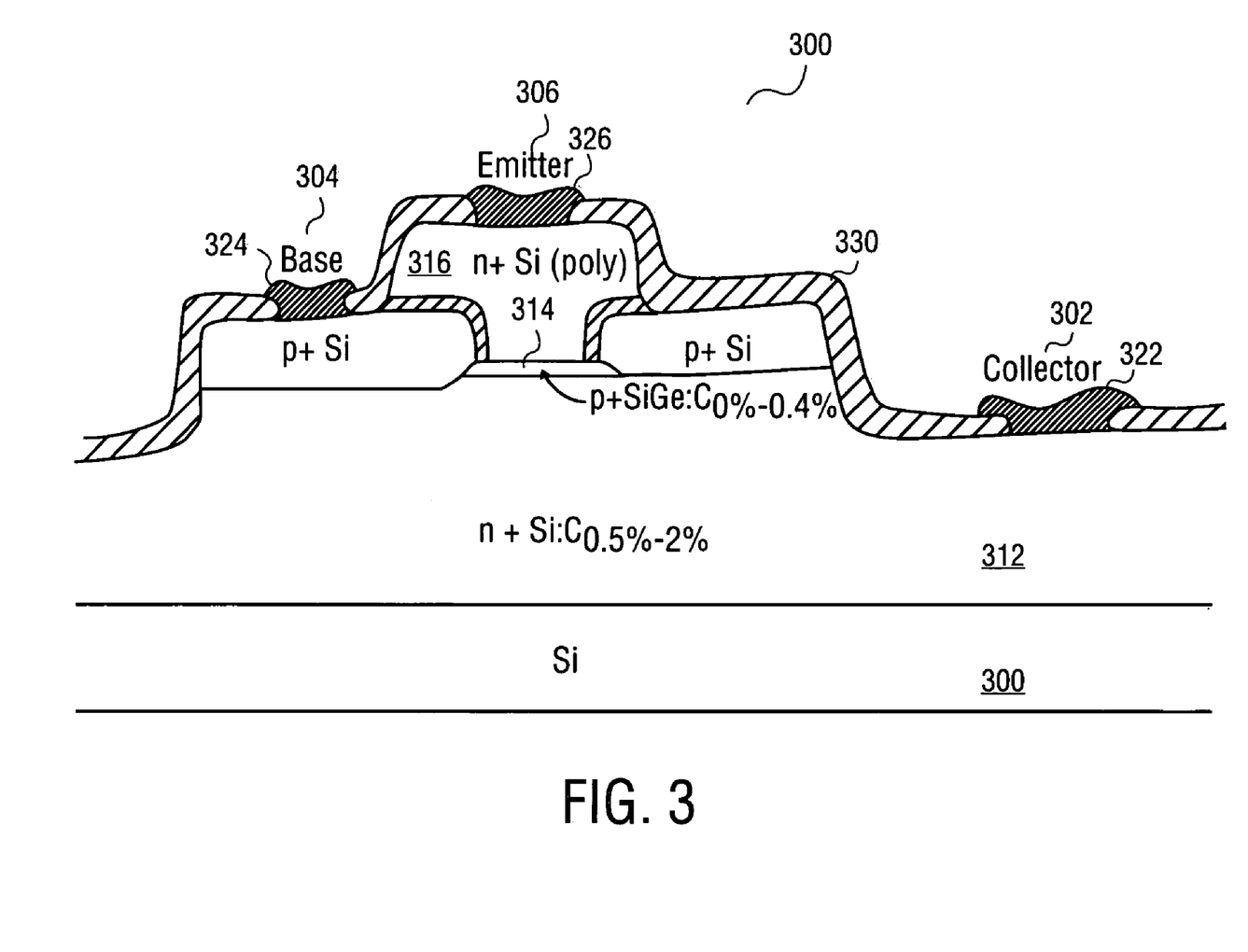
FIG. 3 illustrates a cross-sectional view of a SiGe HBT 300 according to one embodiment of the invention.

FIG. 3 illustrates a cross-sectional view of a SiGe HBT 300 according to one embodiment of the invention. One ordinarily skilled in the art will recognize that numerous methods exist in the art for fabricating a variety of SiGe HBTs, any one of which can be easily modified to produce embodiments of the present invention. FIG. 3 illustrates but one embodiment of the present invention fabricated according to but one fabrication method. Referring to FIG. 3, the SiGe HBT 300 is formed on a silicon substrate 300 and, therefore, may be fabricated alongside PMOS and NMOS transistors. The SiGe HBT 300 includes a collector 302, a base 304, and an emitter 306. The collector 302 includes a n-type silicon layer 312 formed to include a carbon content sufficient to prevent a conduction band barrier at high current operation, for example between about 0.5% to about 2% carbon. In one embodiment of the invention, the collector is substantially free from germanium. The base 304 includes a p-type SiGe film 314 formed to a thickness sufficient to optimize maximum oscillation frequency ($f_{max}$). In other words, the SiGe film 314 is does not need to be scaled as aggressively as a conventional SiGe HBT transistor thus having a thickness (about 15 nm to about 60 nm) that allows for a decreased base resistance resulting in a high $f_{max}$ and which thickness also allows for a steeply graded germanium profile with a high peak confined primarily to the SiGe film 314 resulting in strong electrical fields in the base 304, hence a high $f_T$ at high currents. In one embodiment of the invention, the base 304 includes carbon (e.g., 0% to 0.4%) to prevent out-diffusion of the p-type material (e.g., boron) in the base 304. The carbon content of the base 304 (i.e., the SiGe film 314) does not need to be significant, preferably very small, such as 0.1%, to adequately prevent boron diffusion. Therefore, the base 304 has significantly less carbon content than the carbon content of the collector 302, consequently allowing for the step-up increase in the carbon profile at the base-collector heterojunction. The emitter 306 includes an n-type silicon layer 316, preferably a polysilicon. The emitter 306 is substantially free from carbon and germanium. The collector 302, base 304, and emitter 306, may have metal contacts 322, 324, and 326 respectively, formed of silicide. Oxide materials 330 may be formed to electrically isolate portions of the collector 302, base 304, and emitter 306 from each other or from other subsequently formed adjacent or overlying devices.

Figure 4:
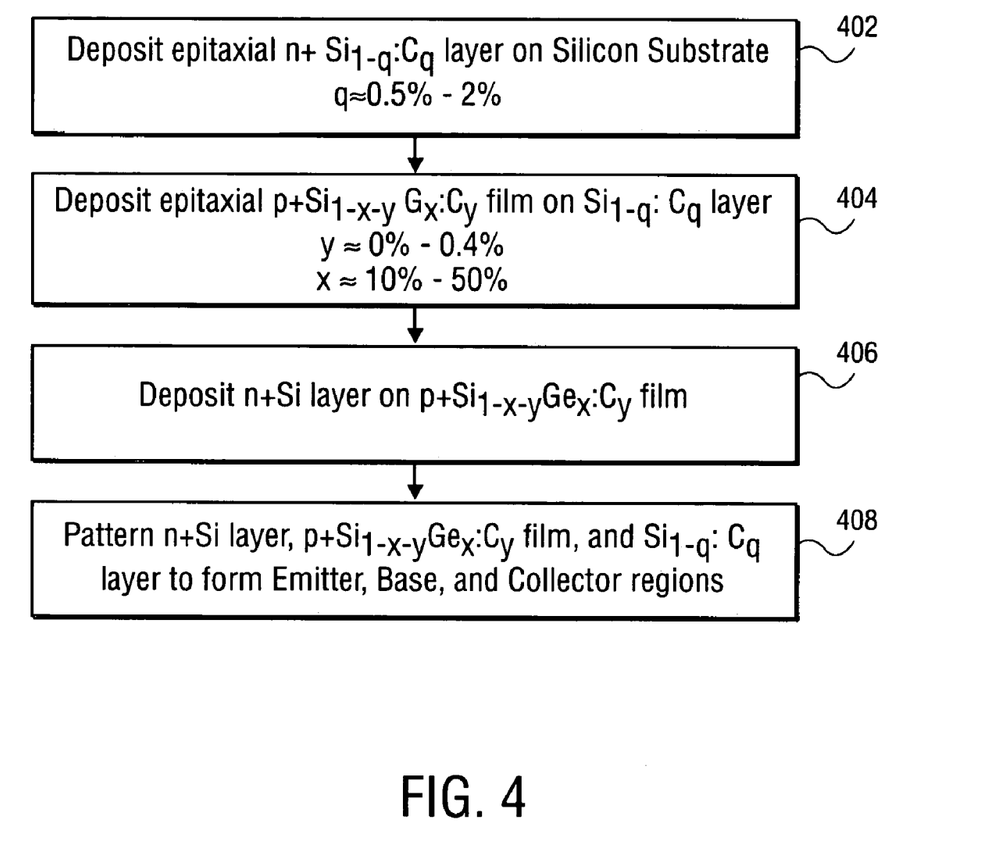
FIG. 4 illustrates a method of forming the SiGe HBT 300 of FIG. 3.

FIG. 4 illustrates a method of forming the SiGe HBT 300. The method begins, as shown at processing block 402, with forming the collector by growing an n-type epitaxial layer of carbon doped silicon ("n+Si$_{1-q}$:C$_q$") on a silicon substrate. The n+Si$_{1-q}$:C$_q$ includes a carbon content between about 0.5% to about 2% carbon, which is between about $2.5 \times 10^{20}$ cm$^{-3}$ to about $1 \times 10^{21}$ cm$^{-3}$ in carbon concentration. As mentioned previously, if the carbon content in the collector is between about 0.5% to about 2%, conduction barrier problems are prevented even for high current density operation. If the carbon content is less than 0.5%, a conduction band barrier may result during high current operation. If the carbon content is higher than 2% other problems result, such as mobility degradation in the collector leading to higher collector resistance and lower $f_{max}$.

Epitaxial layer formation may include a deposition process between about 550° C. to about 675° C. using methylsilane (CH$_3$SiH$_3$) as the carbon source gas and a silane (SiH$_4$) gas as the silicon source gas. Exemplary deposition processes include low-pressure rapid thermal chemical vapor deposition (LP-RTCVD), ultra high vacuum chemical vapor deposition (UHVCVD), or molecular beam epitaxy (MBE). The n+Si$_{1-q}$:C$_q$ may include an in-situ n-type doping, such as with phosphorous, to between about $5 \times 10^{17}$ cm$^{-3}$ to about $5 \times 10^{19}$ cm$^{-3}$ in concentration. N-type doping may be performed by ion implantation. An exemplary thickness may be between about 600 nm to about 1200 nm.

The method continues, as shown at processing block 404, with forming the base by growing an p-type epitaxial layer of carbon doped silicon germanium ("p+Si$_{1-x-y}$Ge$_x$:C$_y$") on the n-type silicon layer of the collector. The p+Si$_{1-x-y}$Ge$_x$:C$_y$ may include a carbon content between about 0% to about 0.4% carbon, preferably 0.1%, or $5 \times 10^{19}$ cm$^{-3}$, in carbon concentration. The germanium content may be formed to any percentage desired, preferably between about 10% to about 50%. Herein, the germanium profile of the SiGe HBT according to various embodiments of the invention (i.e., SiGe HBT 200 and SiGe HBT 300), is described as being "steeply graded" with a "high peak" in the base. The terms "steep" and "high" are qualitative terms and are used to indicate, essentially, that a larger amount of germanium can be confined to the base as compared to conventional SiGe HBTs. The "peak" refers to the highest amount of germanium over a germanium gradient within the base. Thus, according to one embodiment of the invention, a "high peak" may be defined more specifically as being as high as about 50% germanium, at a particular point along the germanium gradient within the base. As for the steepness of the grade, quantifiable terms may be determined by the slope of the germanium content grade. The slope, however, is more difficult to determine quantitatively, but, nonetheless can be compared to a slope of a conventional SiGe HBT. For example, the germanium content in the base of a convention SiGe HBT must extend into the collector, thus, a conventional SiGe HBT allows for, at best, a peak germanium content in the base of around 25%. However, in one embodiment of the invention, the SiGe HBT 300 (and SiGe HBT 200) allows for about a 50% germanium content peak, thus the grade (or slope) of the germanium content in the SiGe HBT 300 (and SiGe HBT 200) is around twice (2×) the slope of the convention SiGe HBT.

Still referring to processing block 404, epitaxial layer formation includes a deposition process at between about 550° C. to about 675° C. using methylsilane as the carbon source gas, silane as the silicon source gas, and germane as the germanium source gas. Exemplary deposition processes include low-pressure rapid thermal chemical vapor deposition (LP-RTCVD), ultra high vacuum chemical vapor deposition (UHVCVD), or molecular beam epitaxy (MBE). The p+Si$_{1-x-y}$Ge$_x$:C$_y$ may include an in-situ p-type doping, such as with boron, to about $5 \times 10^{18}$ cm$^{-3}$. An exemplary thickness for the base may be between about 150 Å to about 600 Å which, as described previously, allows for low intrinsic base resistance, thus resulting in a high $f_{max}$. Thus, the base has a thickness sufficient to optimize maximum oscillation frequency ($f_{max}$).

The method continues, as shown at processing block 406, with forming the emitter by depositing an n-type layer of silicon, preferably polysilicon, above the p-type epitaxial silicon germanium layer of the base. The n-type silicon layer of the emitter may be grown epitaxially, or deposited according to other known deposition techniques, such as chemical vapor deposition (CVD), plasma enhanced CVD, physical vapor deposition (PVD or sputtering), etc. If the n-type silicon layer of the emitter is polysilicon, a typical deposition method may include a high temperature CVD process, for example around about 750° C. The n-type silicon layer 616 may include an in-situ n-type doping, such with arsenic, to about $10^{20}$ cm$^{-3}$ in concentration. An activation anneal may subsequently be performed at about 1000° C.

The method may continue, as shown at processing block 408, with patterning the emitter, base, and collector into the configuration shown in FIG. 3, including utilizing etching techniques, oxide and silicide deposition techniques, and other processing techniques well known in the art in the formation of SiGe HBTs. The method may simultaneously include the formation of PMOS or NMOS transistors on the same silicon substrate upon which the SiGe HBT 300 was formed.

Several embodiments of the invention have thus been described. However, those ordinarily skilled in the art will recognize that the invention is not limited to the embodiments described, but can be practiced with modification and alteration within the spirit and scope of the appended claims that follow.

What is claimed:

1. A bipolar transistor, comprising:
   an emitter;
   a base connected to the emitter, the base having a first carbon content; and
   a collector connected to the base, the collector including a second carbon content to prevent a conduction band barrier at a base-collector junction, wherein the second carbon content is greater than the first carbon content.

2. The bipolar transistor of claim 1, wherein an amount of the second carbon content in the collector is to cause a staggered offset in a conduction band at the base-collector junction at high current operation.

3. The bipolar transistor of claim 1, wherein an amount of the second carbon content in the collector is between about 0.5% to about 2%.

4. The bipolar transistor of claim 1, wherein the collector includes a carbon concentration between about $2.5 \times 10^{20}$ $cm^{-3}$ to about $1 \times 10^{21}$ $cm^{-3}$.

5. The bipolar transistor of claim 1, wherein the base has a steeply graded germanium profile with a high peak and the collector is substantially free from germanium.

6. The bipolar transistor of claim 1, wherein the base has a thickness sufficient to optimize maximum oscillation frequency ($f_{max}$).

7. The bipolar transistor of claim 1, wherein the base has a thickness between about 150 Å to about 600 Å.

8. The bipolar transistor of claim 1, wherein the emitter includes an n-type polysilicon, the base includes a p-type epitaxial silicon-germanium, and the collector includes an n-type epitaxial silicon.

9. A bipolar transistor, comprising:
   an emitter;
   a base connected to the emitter, the base having a first carbon content; and
   a collector connected to the base, the collector including a second carbon content to prevent a conduction band barrier at a base-collector junction, wherein the second carbon content is greater than the first carbon content to prevent out-diffusion of a p-type material in the base and having a step-up increase at the base-collector junction.

10. The bipolar transistor of claim 1, wherein the base is between about 0% to about 0.4% carbon content.

11. A silicon germanium heterojunction bipolar transistor (SiGe HBT), comprising:
    an n-type silicon emitter;
    a p-type silicon germanium base connected to the emitter; and
    an n-type silicon collector connected to the base, the collector including between about 0.5% to about 2% carbon content to cause a staggered offset in a conduction band and prevent a conduction band barrier at a base-collector heterojunction at high current operation, wherein the carbon content of the n-type silicon collector is greater than a carbon content of the p-type silicon germanium base.

12. The SiGe HBT of claim 11, wherein the base has a steeply graded germanium profile with a high peak, and the collector is substantially free from germanium.

13. The SiGe HBT of claim 11, wherein the base has a thickness sufficient to optimize maximum oscillation frequency ($f_{max}$).

14. The SiGe HBT of claim 11, wherein the emitter includes an n-type polysilicon, the base includes a p-type epitaxial silicon-germanium, and the collector includes an n-type epitaxial silicon.

15. The SiGe HBT of claim 11, wherein the base is between about 0% to about 0.4% carbon content to prevent out-diffusion of a p-type material in the base.

16. An integrated circuit, comprising:
    a silicon substrate; and
    a bipolar transistor overlying the substrate, the bipolar transistor including a collector and a base connected at a base-collector junction, the collector including carbon to prevent a conduction band barrier at a base-collector junction, wherein a carbon content of the collector is greater than a carbon content of the base.

17. The integrated circuit of claim 16, wherein the carbon content in the collector is to cause a staggered offset in a conduction band at the base-collector junction at high current operation.

18. The integrated circuit of claim 16, wherein the carbon content in the collector is between about 0.5% to about 2%.

19. The integrated circuit of claim 16, wherein the collector includes a carbon concentration between about $2.5 \times 10^{20}$ $cm^{-3}$ to about $1 \times 10^{21}$ $cm^{-3}$.

20. The integrated circuit of claim 16, wherein the base has a steeply graded germanium profile with a high peak, and the collector is substantially free from germanium.

21. The integrated circuit of claim 16, wherein the base has a thickness sufficient to optimize maximum oscillation frequency ($f_{max}$) for a given cutoff frequency ($f_T$).

22. The integrated circuit of claim 16, wherein the emitter includes an n-type polysilicon, the base includes a p-type epitaxial silicon-germanium, and the collector includes an n-type epitaxial silicon.

23. An integrated circuit, comprising:
    a silicon substrate; and
    a bipolar transistor overlying the substrate, the bipolar transistor including a collector and a base connected at a base-collector junction, the collector including carbon to prevent a conduction band barrier at a base-collector junction, wherein a carbon content of the collector is greater than a carbon content of the base to prevent out-diffusion of a p-type material in the base and having a step-up increase at the base-collector heterojunction.

24. The integrated circuit of claim 16, wherein the base is between about 0% to about 0.4% carbon content.

25. The integrated circuit of claim 16, further comprising any one of an nMOS or a pMOS transistor formed into the substrate.

* * * * *